(12) United States Patent
Chung et al.

(10) Patent No.: US 7,939,392 B2
(45) Date of Patent: May 10, 2011

(54) METHOD FOR GATE HEIGHT CONTROL IN A GATE LAST PROCESS

(75) Inventors: Sheng-Chen Chung, Jhubei (TW);
Kong-Beng Thei, Hsin-Chu County (TW); Harry Chuang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 141 days.

(21) Appl. No.: 12/489,053

(22) Filed: Jun. 22, 2009

(65) Prior Publication Data
US 2010/0087056 A1    Apr. 8, 2010

Related U.S. Application Data

(60) Provisional application No. 61/102,968, filed on Oct. 6, 2008.

(51) Int. Cl.
*H01L 21/338* (2006.01)
(52) U.S. Cl. ............. 438/183; 438/692; 257/E21.444; 257/E21.453
(58) Field of Classification Search .............. None
See application file for complete search history.

(56) References Cited

U.S. PATENT DOCUMENTS

| 2010/0065925 A1* | 3/2010 | Huang et al. ............. 257/410 |
| 2010/0065926 A1* | 3/2010 | Yeh et al. ............. 257/410 |
| 2010/0087055 A1* | 4/2010 | Lai et al. ............. 438/585 |

* cited by examiner

*Primary Examiner* — Jarrett J Stark
(74) *Attorney, Agent, or Firm* — Haynes and Boone, LLP

(57) ABSTRACT

A method is provided for fabricating a semiconductor device that includes providing a semiconductor substrate, forming a transistor in the substrate, the transistor having a gate structure that includes a dummy gate structure, forming an interlayer dielectric (ILD), performing a first chemical mechanical polishing (CMP) to expose a top surface of the dummy gate structure, removing a portion of the ILD such that a top surface of the ILD is at a distance below the top surface of the dummy gate structure, forming a material layer over the ILD and dummy gate structure, performing a second CMP on the material layer to expose the top surface of the dummy gate structure, removing the dummy gate structure thereby forming a trench, forming a metal layer to fill in the trench, and performing a third CMP that substantially stops at the top surface of the ILD.

20 Claims, 7 Drawing Sheets

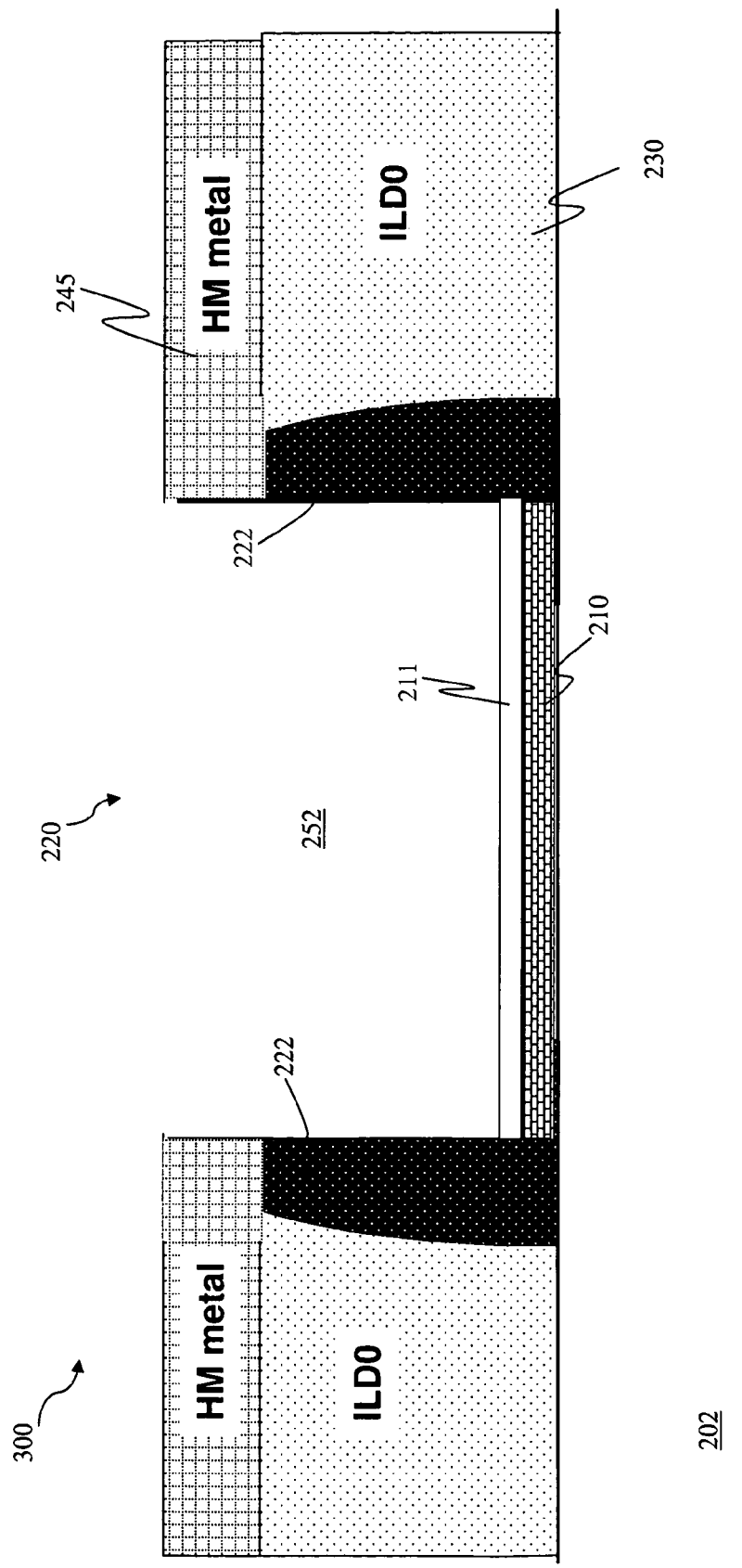

METHOD FOR GATE HEIGHT CONTROL IN A GATE LAST PROCESS

PRIORITY DATA

This application claims priority to Provisional Application Ser. No. 61/102,968 filed on Oct. 6, 2008, entitled "Method For Gate Height Control In A Gate Last Process," the entire disclosure of which is incorporated herein by reference.

BACKGROUND

As technology nodes shrink, in some IC designs, there has been a desire to replace the typically polysilicon gate electrode with a metal gate electrode to improve device performance with the decreased feature sizes. Providing metal gate structures (e.g., including a metal gate electrode rather than polysilicon) offers one solution. One process of forming a metal gate stack is termed "gate last" process in which the final gate stack is fabricated "last" which allows for reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high dielectric constant (high-k) gate insulator layers are also used which allow greater physical thicknesses while maintaining the same effective thickness as would be provided by a typical gate oxide used in larger technology nodes.

There are challenges to implementing such features and processes in CMOS fabrication however. As the gate lengths decrease, these problems are exacerbated. For example, in a "gate last" fabrication process, problems have arisen with control of the gate height, unintended removal of an inter-layer dielectric, and non-uniformity of a chemical mechanical polishing (CMP) process.

SUMMARY

One of the broader forms of an embodiment of the present invention involves a method of fabricating a semiconductor device. The method includes providing a semiconductor substrate; forming a transistor in the substrate, the transistor having a gate structure that includes a dummy gate structure; forming an inter-layer dielectric (ILD) over the substrate and the transistor; performing a first chemical mechanical polishing (CMP) on the ILD to expose a top surface of the dummy gate structure; removing a portion of the ILD such that a top surface of the ILD is at a distance below the top surface of the dummy gate structure; forming a material layer over the ILD and dummy gate structure; performing a second CMP on the material layer to expose the top surface of the dummy gate structure; removing the dummy gate structure thereby forming a trench; forming a metal layer to fill in the trench; and performing a third CMP that substantially stops at the top surface of the ILD.

Another one of the broader forms of an embodiment of the present invention involves a method of fabricating a semiconductor device. The method includes providing a semiconductor substrate; forming a gate stack on the substrate, the gate stack including a dummy gate structure; forming an inter-layer dielectric (ILD) over the substrate and the gate stack; performing a first chemical mechanical polishing (CMP) such that a first top surface of the ILD and a top surface of the dummy gate structure are substantially co-planar; removing a portion of the ILD resulting in a second top surface of the ILD, the second top surface of the ILD and the top surface of the dummy gate structure being substantially non-planar; forming a hard mask layer over the ILD and the dummy gate structure; performing a second CMP on the hard mask layer to expose the dummy gate structure; removing the dummy gate structure from the gate stack thereby forming a trench; forming a metal layer to fill in the trench; and performing a third CMP that substantially stops at the second top surface of the ILD.

Yet another one of the broader forms of an embodiment of the present invention involves a method of fabricating a semiconductor device. The method includes providing a semiconductor substrate; forming a transistor having a gate stack disposed on the substrate, the gate stack including an interfacial layer, a high-k dielectric layer, a dummy poly gate; forming an inter-layer dielectric (ILD) over the substrate and the transistor; planarizing the ILD to expose a top surface of the dummy poly gate; removing a portion of the ILD such that a top surface of the ILD is at a distance below the top surface of the dummy poly gate; forming a first metal layer over the ILD and the dummy poly gate; planarizing the first metal layer to expose the top surface of the dummy poly gate; removing the dummy poly gate from the gate stack thereby forming a trench; forming a second metal layer to fill in the trench; and planarizing the substrate until the top surface of the ILD is exposed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2F are cross-sectional views of a semiconductor device at various stages of fabrication according to the method of FIG. 1.

DETAILED DESCRIPTION

Figure 1:
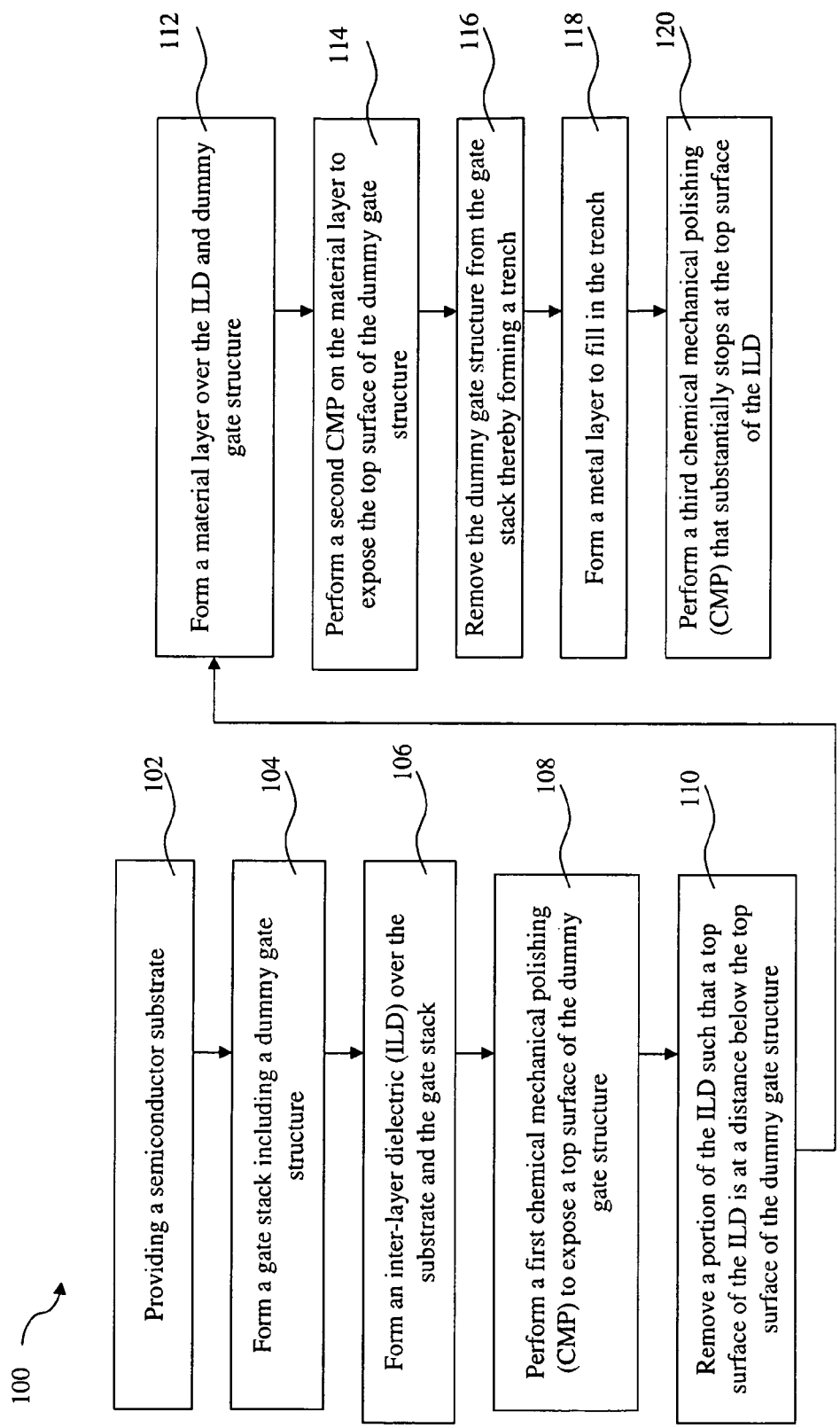
FIG. 1 is a flowchart of a method of fabricating a semiconductor device in a gate last process according to various aspects of the present disclosure.

The present disclosure relates generally to forming an integrated circuit device on a substrate and, more particularly, to fabricating a gate structure as part of an integrated circuit (including FET devices). It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however one skilled in the art may recognize applicability to other processes and/or use of other materials.

Referring to FIG. 1, illustrated is a flowchart of a method 100 for fabricating a semiconductor device in a "gate last" process. Referring also to FIGS. 2A to 2F, illustrated are cross-sectional views of a semiconductor 200 at various stages of fabrication in a gate last process according to the method 100 of FIG. 1. The semiconductor device 200 may be an integrated circuit, or portion thereof, that may comprise static random access memory (SRAM) and/or other logic circuits, passive components such as resistors, capacitors, and inductors, and active components such as P-channel field effect transistors (pFET), N-channel FET (nFET), metal-oxide semiconductor field effect transistors (MOSFET), complementary metal-oxide semiconductor (CMOS) transistors, bipolar transistors, high voltage transistors, high frequency transistors, other memory cells, and combinations thereof. It is understood that the semiconductor device 200 shown in FIGS. 2A to 2F may include various other features formed with a CMOS process flow but has been simplified for a better understanding of the inventive concepts of the present disclosure. Accordingly, it is understood that additional processes may be provided before, during, and after the method 100 of FIG. 1, and that some other processes may only be briefly described herein.

Figure 2A:
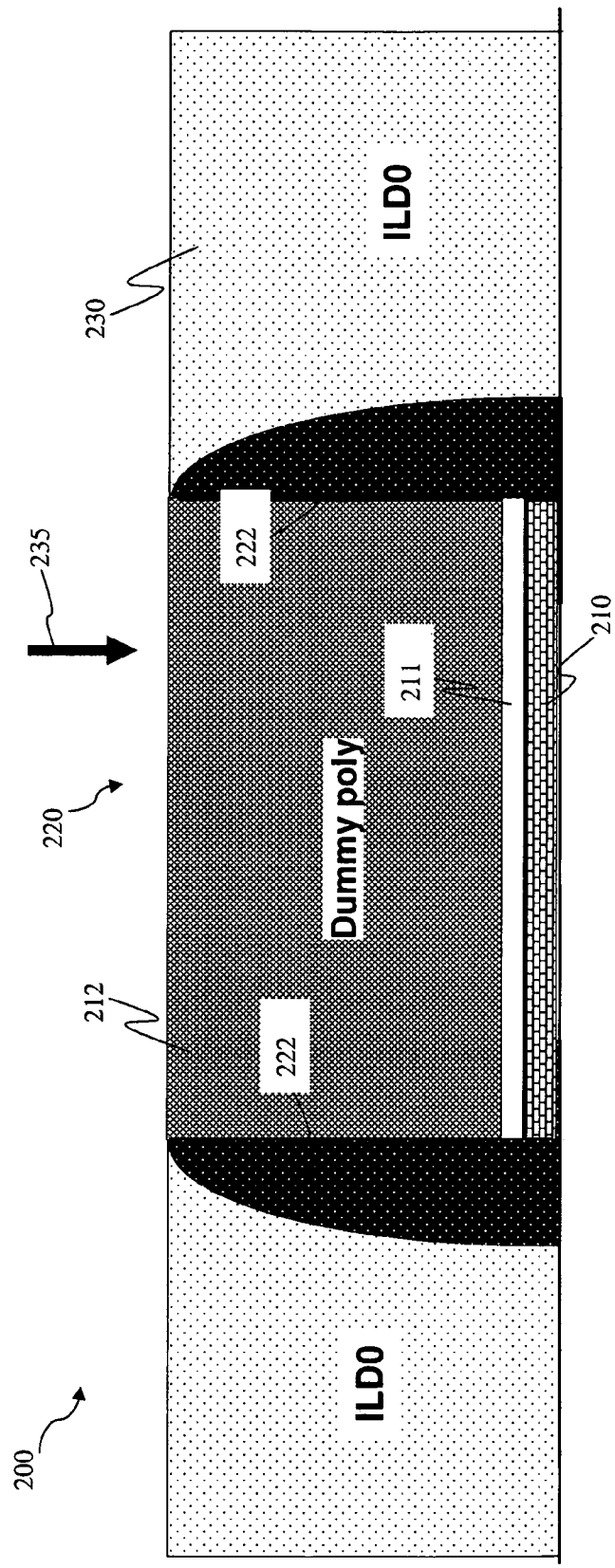

The method 100 begins with block 102 in which a semiconductor substrate may be provided. In FIG. 2A, the semiconductor device 200 may include a substrate 202. In the present embodiment, the substrate 202 includes a silicon substrate (e.g., wafer) in crystalline structure. The substrate 202 may include various doping configurations depending on design requirements as is known in the art (e.g., p-type substrate or n-type substrate) Additionally, the substrate 202 may include various doped regions such as p-type wells (p-wells) or n-type wells (n-wells). Other examples of the substrate 202 may also include other elementary semiconductors such as germanium and diamond. Alternatively, the substrate 202 may include a compound semiconductor such as, silicon carbide, gallium arsenide, indium arsenide, or indium phosphide. Further, the substrate 202 may optionally include an epitaxial layer (epi layer), may be strained for performance enhancement, and/or may include a silicon-on-insulator (SOI) structure.

The semiconductor device 200 may include isolation structures such as shallow trench isolation (STI) features formed in the substrate 202 to isolate one or more devices from each other. The STI features may include silicon oxide, silicon nitride, silicon oxynitride, fluoride-doped silicate glass (FSG), and/or a low-k dielectric material. Other isolation methods and/or features are possible in lieu of or in addition to STI. The STI features may be formed using processes such as reactive ion etch (RIE) of the substrate 202 to form trenches which are then filled with an insulator material using deposition processes followed by a CMP process.

The method 100 continues with block 104 in which a gate stack may be formed on the substrate, the gate stack including a dummy gate structure. The formation of the gate stack includes forming various material layers, and patterning the various material layers to form the gate stack for nFET or pFET devices, for example. The gate stack may include a dummy gate structure that will be removed and replaced with a metal material in a gate last process flow as discussed below.

The semiconductor device 200 may include a gate dielectric 210 formed over the substrate. The gate dielectric 210 may include an interfacial layer. The interfacial layer may include a silicon oxide layer (e.g., thermal or chemical oxide formation) having a thickness ranging from about 5 to about 10 angstrom (A). The gate dielectric 210 may further include a high dielectric constant (high-k) material layer formed on the interfacial layer. In an embodiment, the high-k dielectric material includes hafnium oxide ($HfO_2$). Other examples of high-k dielectrics include hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. The high-k dielectric layer may be formed by atomic layer deposition (ALD) or other suitable technique. The high-k dielectric layer may include a thickness ranging from about 10 to about 30 angstrom (A).

In some embodiments, a capping layer may be formed over the high-k dielectric layer for tuning an effective work function of the gate electrode for properly performing as nFET or pFET devices. For example, the capping layer may include $Al_2O_3$, $La_2O_3$, or other suitable materials. In other embodiments, a barrier layer 211 may be formed over the high-k dielectric layer. The barrier layer 211 may include TiN, TaN, or other suitable materials. The barrier layer 211 may be formed by various deposition techniques such as ALD, physical vapor deposition (PVD or sputtering), chemical vapor deposition (CVD), or other suitable process.

The semiconductor device 200 may further include a polysilicon (or poly) layer 212 formed over the gate dielectric 210 by CVD or other suitable deposition process. For example, silane ($SiH_4$) may be used a chemical gas in the CVD process to form the poly layer 212. The poly layer 212 may include a thickness ranging from about 400 to about 800 angstrom (A). The semiconductor layer may alternatively include an amorphous silicon layer. A hard mask layer may be formed over the poly layer 212. The hard mask layer may include silicon oxide, silicon nitride, silicon oxynitride, and/or other suitable materials. The hard mask layer may be formed using methods such as CVD), physical vapor deposition (PVD), or atomic layer deposition (ALD). Additionally, an anti-reflective coating (ARC) layer or bottom anti-reflective coating (BARC) layer may be formed on the hard mask layer to enhance a subsequent patterning process as is known in the art.

A patterned photoresist layer may be formed on the hard mask layer. The patterned photoresist layer may include a gate pattern for an nFET or pFET device. The gate pattern may be formed by photolithography, immersion lithography, ion-beam writing, or other suitable process. The hard mask layer may be patterned by a dry or wet etching process using the patterned photoresist as a mask, and the patterned hard mask layer may be used to pattern a gate structure 220. The gate structure 220 may be formed by a dry or wet etching process (e.g., gate etching or patterning). For example, the dry etching process may use a fluorine-containing plasma (e.g., etch gas includes $CF_4$). Alternatively, the etching process may include multiple etching steps to etch the various gate material layers. The patterned photoresist layer may be removed by a stripping or ashing process. The gate structure 220 may include a hard mask layer, a dummy poly layer 212, a barrier layer 211, and a gate dielectric layer 210n (including an interfacial layer and high-k dielectric layer).

After gate patterning, it is understood that the semiconductor device 200 may undergo further processing in a CMOS process flow to form various features as is known in the art. For example, gate or sidewall spacers 222 may be formed on the sidewalls of the gate structure 220. The spacers 222 may be formed of silicon oxide, silicon nitride, silicon oxynitride, silicon carbide, fluoride-doped silicate glass (FSG), a low k dielectric material, combinations thereof, and/or other suitable material. The spacers 222 may have a multiple layer structure, for example, including one or more liner layers. The liner layer may include a dielectric material such as silicon oxide, silicon nitride, and/or other suitable materials. The spacers 222 may be formed by methods including deposition of suitable dielectric material and anisotropically etching the material to form the spacer 222 profile.

Also, source/drain (S/D) regions may be formed in the substrate 202. The S/D regions may include lightly doped source/drain (LDD) regions and heavy doped source/drain regions. It should be noted that the LDD regions may be formed prior to formation of the spacers 222. The S/D regions may be formed by implanting p-type or n-type dopants or impurities into the substrate 202 depending on the desired transistor configuration (e.g., nFET or pFET). The S/D regions may be formed by methods including photolithography, ion implantation, diffusion, and/or other suitable processes. Additionally, the S/D regions of the pFET device may include raised S/D regions and/or SiGe features. For example, the SiGe features may be formed by an epitaxy process such that the SiGe features can be formed in a crystalline state in the substrate 202. Thus, a strained channel may be achieved in a pMOS device to increase carrier mobility and enhance device performance.

Further, contact features such as silicide may be formed and coupled to the S/D regions. The contact features may be formed on the S/D regions by a salicide (self-aligned silicide) process. For example, a metal material may formed next to silicon structures, then the temperature is raised to anneal and cause a reaction between the underlying silicon and metal material to form silicide, and the un-reacted metal may be etched away. The contacts may include nickel silicide, cobalt silicide, tungsten silicide, tantalum silicide, titanium silicide, platinum silicide, erbium silicide, palladium silicide, or combinations thereof. A contact etch stop layer (CESL) may be formed over substrate 202 and the gate stack 220. The CESL may be formed of silicon nitride, silicon oxynitride, and/or other suitable materials. The CESL composition may be selected based upon etching selectivity to one or more additional features of the semiconductor device 200. Further, the CESL may be configured as a tensile-CESL or a compressive-CESL depending on the desired transistor configuration.

The method 100 continues with block 106 in which an inter-layer dielectric (ILD) may be formed over the substrate and the gate stack. A dielectric layer such as an inter-layer (or level) dielectric (ILD) layer 230 may be formed overlying the CESL by chemical vapor deposition (CVD), high density plasma CVD, spin-on, sputtering, or other suitable methods. The ILD layer 230 may include silicon oxide, silicon oxynitride, or a low-k material. In an embodiment, the ILD layer 230 may include a high density plasma (HDP) dielectric and a high aspect ratio process (HARP) dielectric for gap filling.

The method 100 continues with block 108 in which a first chemical mechanical polishing (CMP) may be performed on the ILD to expose a top surface of the dummy gate structure. In a gate last process, the dummy poly gate structure 212 may be removed so that a resulting metal gate structure may be formed in place of the dummy poly gate structure 212. Accordingly, the ILD layer 230 may be planarized by a chemical mechanical polishing (CMP) process 235 until a top surface of the dummy poly gate 212 is exposed or reached. It should be noted that the top surface of the dummy poly gate 212 and the top surface of the ILD 230 may be substantially co-planar following the CMP process 235. Alternatively, the CMP process may be performed to expose the hard mask layer and then an etching process such as a wet etch dip may be applied to remove the hard mask layer thereby exposing the dummy poly gate 212.

Figure 2B:
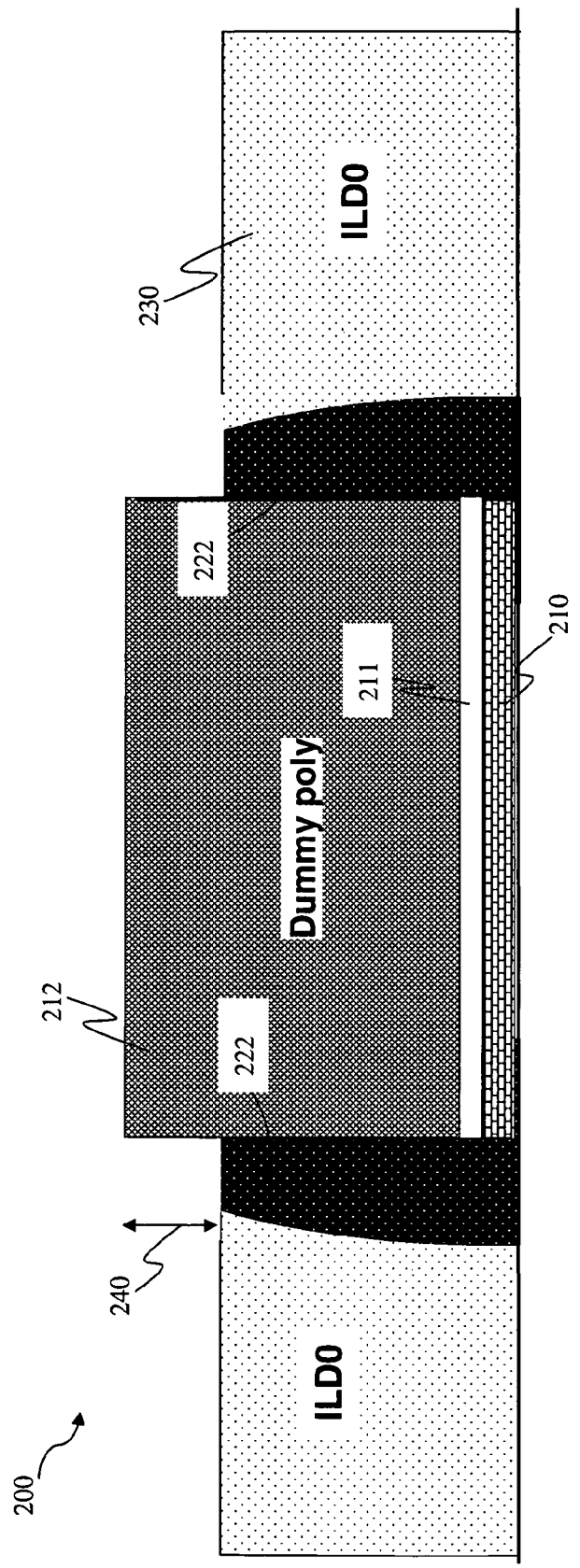

The method 100 continues with block 110 in which a portion of the ILD may be removed such that a top surface of the ILD is at a distance below the top surface of the dummy gate structure. In FIG. 2B, semiconductor device 200 may undergo a wet etch process (e.g., wet etch dip) that selectivity removes a portion of the ILD layer 230 but does not remove the dummy poly gate 212. For example, the wet etch dip may include a dilute HF solution and/or other suitable etchant solutions that have a high selectivity between polysilicon (dummy poly gate)/silicon oxide (ILD layer). The thickness of the ILD layer 230 may be reduced from 50 to about 150 angstrom (A). In other words, the ILD layer 230 may have a top surface that is at a distance 240 ranging from 50 to about 150 angstrom (A) below the top surface of the dummy poly gate 212 following the wet etch dip process. The desired thickness of the ILD layer 230 to be etched may be achieved by precisely controlling the etching time of the wet etch dip process.

Figure 2C:
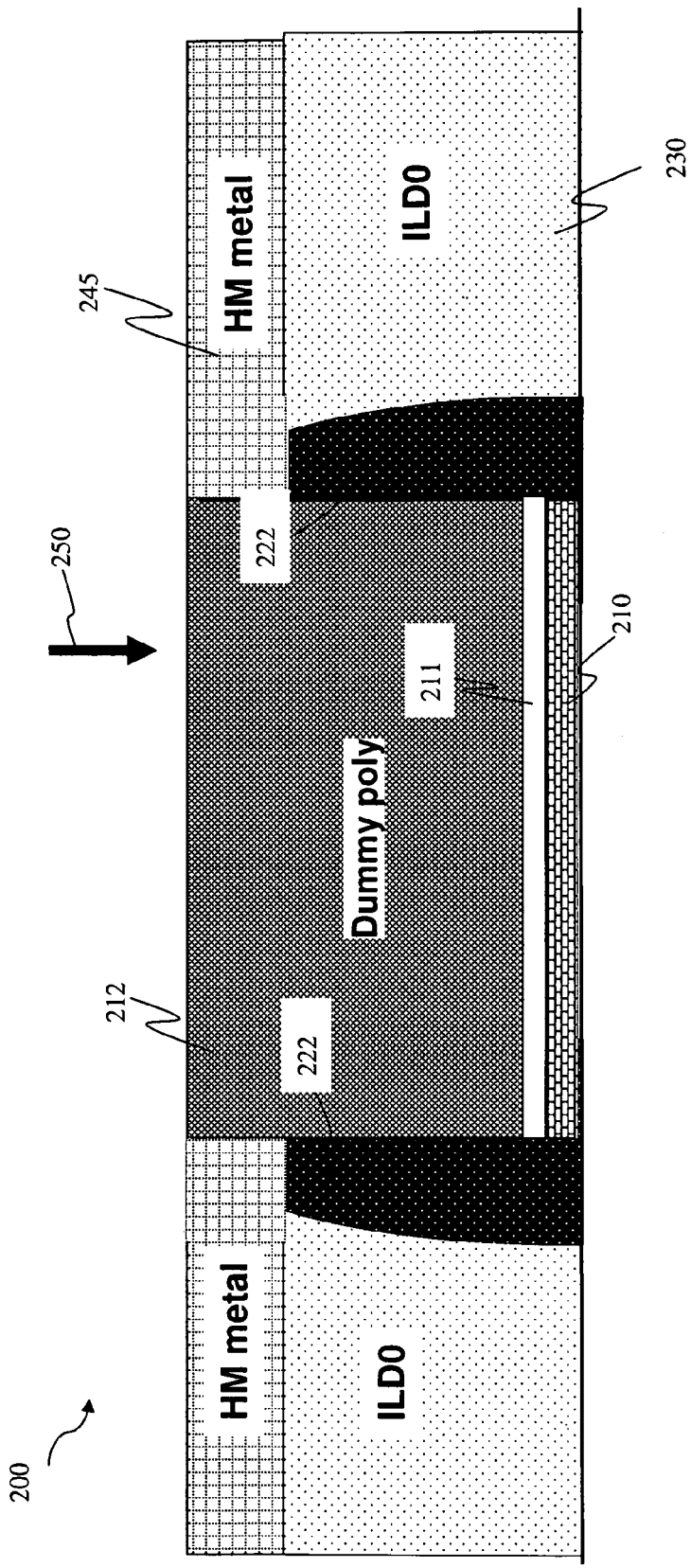

The method 100 continues with block 112 in which a material layer may be formed over the ILD and the dummy gate structure. In FIG. 2C, the material layer 245 may be formed over the ILD 230 and the dummy poly gate 212. The material layer 245 may be formed of a different material from the ILD layer 230 and a different material from the dummy poly gate 212. The material layer 245 may function as a hard mask layer to protect the underlying ILD layer 230. In the present embodiment, the material layer 245 may include a metal material formed by PVD, CVD, or other suitable process. For example, the metal material may include TiN, TaN, Al, combinations thereof, or other suitable metal material. The metal material 245 may be formed of a same material as a subsequent metal gate that is formed to replace the dummy poly gate 212 as discussed below. The method 100 continues with block 114 in which a second CMP process may be performed on the material layer to expose the dummy gate structure. A CMP process 250 may be performed on the material layer 245 to planarize and remove the excess material layer such that the top surface of the dummy poly gate 212 is exposed. It should be noted that the top surface of the dummy poly gate and the top surface of the material layer are substantially co-planar following the CMP process 250.

The method 100 continues with block 116 in which the dummy gate structure may be removed from the gate stack thereby forming a trench. In FIG. 2D, following the CMP process 250, the dummy gate structure 212 may be removed from the gate stack 220. For example, polysilicon is selectively etched removing the dummy poly gate 212. The selective removal of the dummy poly gate 212 provides a trench 252 within which a metal gate may be formed. The dummy poly gate 212 may be removed using a wet etch and/or a dry etch process. The barrier layer 211 may be used as an etch barrier for the etch process. In an embodiment, a wet etch process includes exposure to a hydroxide containing solution (e.g., ammonium hydroxide), deionized water, and/or other suitable etchant solutions. It should be noted that the material layer 245 may protect the ILD layer 230 and prevent removal of the ILD layer 230 during the wet etch process.

Figure 2E:
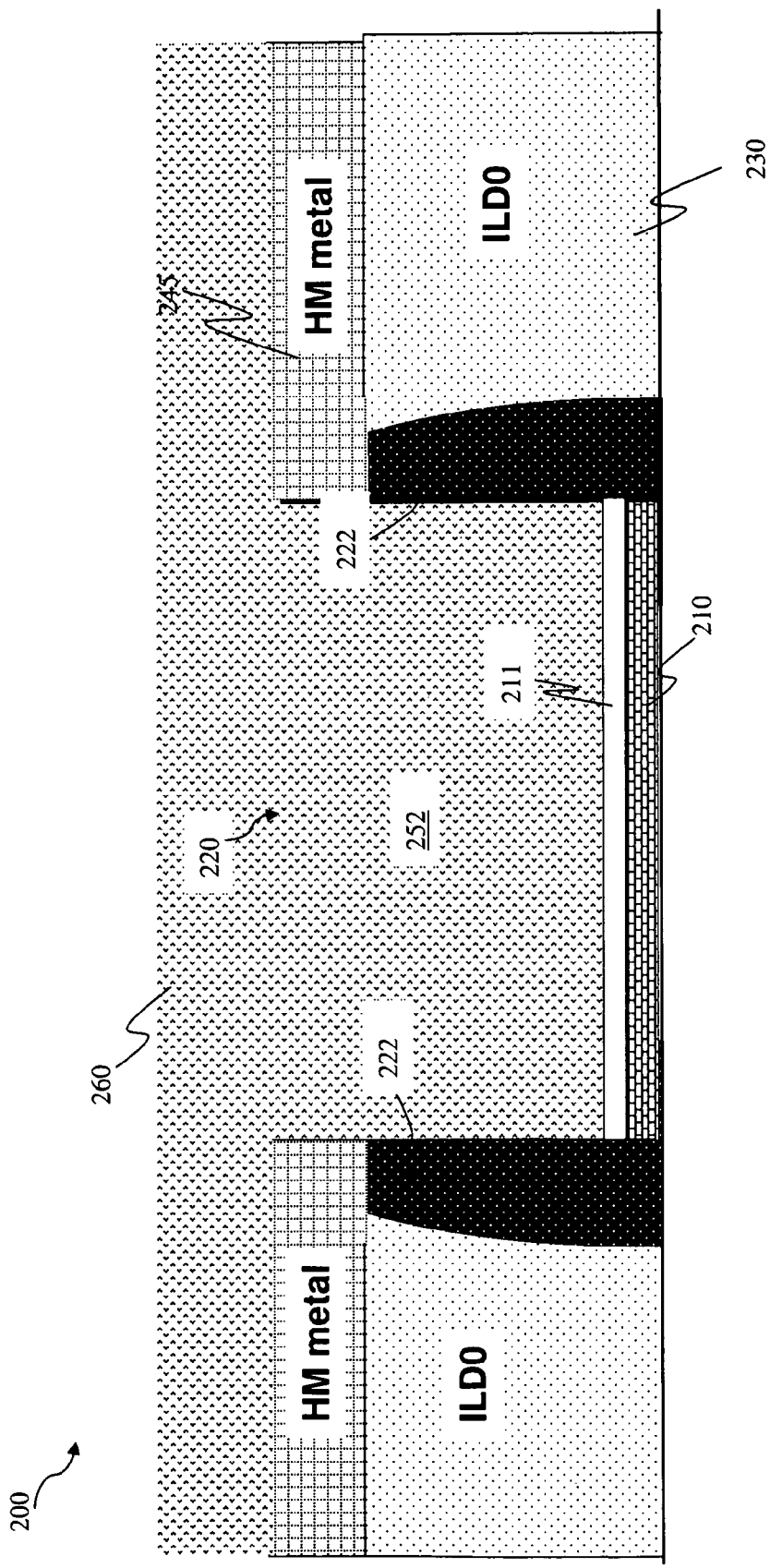

The method 100 continues with block 118 in which a metal layer may be formed to fill in the trench. In FIG. 2E, the metal layer 260 may be deposited to substantially fill in the trench 252. The metal layer 260 deposited may be any metal material suitable for forming a metal gate or portion thereof, including work function (WF) layers, fill layers, liner layers, interface layers, seed layers, adhesion layers, barrier layers, etc. The metal layer 260 may include one or more layers including TiN, TaN, TaC, TaSiN, WN, TiAl, TiAlN, combinations thereof, and/or other suitable materials. The metal layer 260 may be formed by PVD or other suitable processes. Examples of metals that may be deposited include P-type work function metals (P-metals) for pFET devices and N-type work function metals (N-metals) for nFET devices. The metal layer 260 may further include a fill metal layer formed on the WF metal. The fill metal layer may include aluminum (Al) or tungsten (W), or other suitable materials. In an embodiment, the fill metal may include a Ti layer that functions as a wetting layer and an Al layer to fill in the remainder of the trench 252. The fill metal layer may be deposited using CVD, PVD, plating, or other suitable process.

Figure 2F:
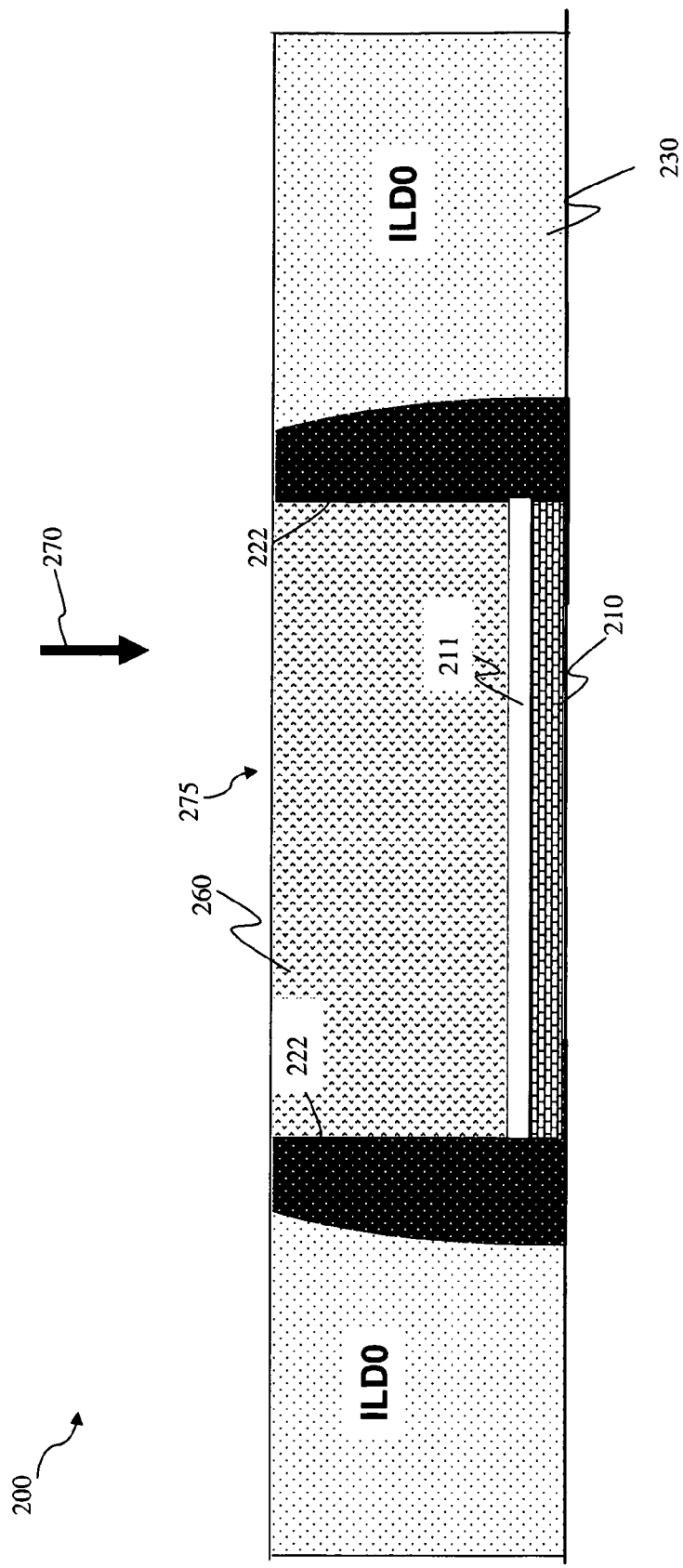

The method 100 continues with block 120 in which a third CMP process may be performed that substantially stops at the top surface of the ILD. In FIG. 2F, a CMP process 270 may be performed to planarize the semiconductor device 200. The CMP process 270 may remove all of the material layer 245 and a portion of the metal layer 260 until the top surface of the ILD layer 230 is reached. The CMP process 270 provides the semiconductor device 200 with a metal gate structure 275. It has been observed that the material layer 245 (formed of metal material) overlying the ILD layer 230 may improve uniformity of the CMP process 270 and may provide better control of the gate height in a gate last process. Further, as previously noted, the material layer 245 may be formed of the same metal material as the metal layer 260. In an embodiment, the material layer 245 may be formed of the same WF metal as the metal layer 260. Accordingly, the CMP process 270 to remove the material layer and a portion the metal layer In embodiments, the method 100 may continue to include additional process steps such as deposition of passivation layers, formation of contacts, interconnect structures (e.g., lines and vias, metal layers, and interlayer dielectric that provide electrical interconnection to the device including the formed metal gate). For example, a multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure.

In summary, a gate last process may be implemented to form metal gate structures for high-k metal gate technology. However, various problems have arisen with the gate last process such as gate height control, unintended removal of the ILD layer, and non-uniformity of the CMP process. Accordingly, device performance and reliability have suffered. The methods and devices disclosed herein provide a hard mask layer formed of a metal material that addresses the above-mentioned problems in the gate last process. The hard mask layer may be formed on the ILD prior to removal of the dummy poly gate. In some embodiments, the hard mask layer may include the same metal that is used to form the metal gate. In some other embodiments, the hard mask layer may include a different metal. The hard mask layer may minimize loss of the gate height, and thus provides for better control of the gate height during subsequent CMP processing. Further, the metal material of the hard mask layer provides for better uniformity of the CMP process that planarizes the metal gate. Moreover, the methods and devices disclosed herein are compatible with current CMOS technology process flow, and are easily integrated with current processing equipment and device technologies.

While the preceding description shows and describes one or more embodiments, it will be understood by those skilled in the art that various changes in form and detail may be made therein without departing from the spirit and scope of the present disclosure. For example, although the methods disclosed herein implement a "gate last" approach, the methods disclosed herein may be used in a hybrid process in which one type of metal gate is formed in a "gate first" process flow and the other type of metal gate is formed in a "gate last" process flow.

What is claimed is:

1. A method of fabricating a semiconductor device comprising:

providing a semiconductor substrate;
forming a transistor in the substrate, the transistor having a gate structure that includes a dummy gate structure;
forming an inter-layer dielectric (ILD) over the substrate and the transistor;
performing a first chemical mechanical polishing (CMP) on the ILD to expose a top surface of the dummy gate structure;
removing a portion of the ILD such that a top surface of the ILD is at a distance below the top surface of the dummy gate structure;
forming a material layer over the ILD and dummy gate structure;
performing a second CMP on the material layer to expose the top surface of the dummy gate structure;
removing the dummy gate structure thereby forming a trench;
forming a metal layer to fill in the trench; and
performing a third CMP that substantially stops at the top surface of the ILD.

2. The method of claim 1, wherein the removing a portion of the ILD includes removing a portion of the ILD such that the top surface of the ILD is at 50 to about 150 angstrom (A) below the top surface of the dummy gate structure.

3. The method of claim 1, wherein the metal layer includes a multi-metal layer including a work function metal and a fill metal.

4. The method of claim 3, wherein the material layer includes the work function metal.

5. The method of claim 3, wherein the work function metal includes an N-type work function metal or P-type work function metal.

6. The method of claim 3, wherein the fill metal includes Al.

7. The method of claim 1, wherein the dummy gate structure includes polysilicon and wherein the ILD includes silicon oxide.

8. The method of claim 7, wherein the material layer includes a metal material.

9. The method of claim 1, wherein the removing a portion of the ILD includes removing a portion of the ILD by a wet etch dip process.

10. The method of claim 1,
wherein the gate structure further includes an interfacial layer formed on the substrate, a high-k dielectric layer formed on the interfacial layer, and a barrier layer formed on the high-k dielectric layer; and
wherein the dummy gate structure is formed on the barrier layer.

11. A method of fabricating a semiconductor device comprising:

providing a semiconductor substrate;
forming a gate stack on the substrate, the gate stack including a dummy gate structure;
forming an inter-layer dielectric (ILD) over the substrate and the gate stack;
performing a first chemical mechanical polishing (CMP) such that a first top surface of the ILD and a top surface of the dummy gate structure are substantially co-planar;
removing a portion of the ILD resulting in a second top surface of the ILD, the second top surface of the ILD and the top surface of the dummy gate structure being substantially non-planar;
forming a hard mask layer over the ILD and the dummy gate structure;
performing a second CMP on the hard mask layer to expose the dummy gate structure;

removing the dummy gate structure from the gate stack thereby forming a trench;

forming a metal layer to fill in the trench; and performing a third CMP that substantially stops at the second top surface of the ILD.

12. The method of claim 11, wherein the forming the metal layer includes:

forming a work function metal layer to partially fill in the trench; and forming a fill metal layer on the work function metal layer to fill in a remainder of the trench.

13. The method of claim 12, wherein the hard mask layer is formed of the same metal as the work function metal layer.

14. The method of claim 11, wherein the hard mask layer is formed of a metal material different from the metal layer.

15. The method of claim 11, wherein the second top surface of the ILD is about 50 to about 150 angstrom (A) below the top surface of the dummy gate structure.

16. The method of claim 11, wherein the dummy gate structure includes a polysilicon.

17. The method of claim 16, wherein the gate stack further includes an interfacial layer formed on the substrate, a high-k dielectric layer formed on the interfacial layer, and a barrier layer formed on the high-k dielectric layer; and wherein the dummy gate structure is formed on the barrier layer.

18. A method for fabricating a semiconductor device, the method comprising:

providing a semiconductor substrate;

forming a transistor having a gate stack disposed on the substrate, the gate stack including an interfacial layer, a high-k dielectric layer, a dummy poly gate;

forming an inter-layer dielectric (ILD) over the substrate and the transistor;

planarizing the ILD to expose a top surface of the dummy poly gate;

removing a portion of the ILD such that a top surface of the ILD is at a distance below the top surface of the dummy poly gate;

forming a first metal layer over the ILD and the dummy poly gate;

planarizing the first metal layer to expose the top surface of the dummy poly gate;

removing the dummy poly gate from the gate stack thereby forming a trench;

forming a second metal layer to fill in the trench; and planarizing the substrate until the top surface of the ILD is exposed.

19. The method of claim 18, wherein the distance is about 50 to about 150 angstrom (A).

20. The method of claim 19, wherein the first metal layer and the second metal layer include a same metal.

\* \* \* \* \*